United States Patent [19]
Gheewala

[11] Patent Number: 5,799,021
[45] Date of Patent: Aug. 25, 1998

[54] METHOD FOR DIRECT ACCESS TEST OF EMBEDDED CELLS AND CUSTOMIZATION LOGIC

[75] Inventor: Tushar R. Gheewala, Los Altos, Calif.

[73] Assignee: Duet Technologies, Inc., San Jose, Calif.

[21] Appl. No.: 822,383

[22] Filed: Mar. 20, 1997

Related U.S. Application Data

[63] Continuation of Ser. No. 726,726, Oct. 7, 1996, abandoned, which is a continuation of Ser. No. 330,888, Oct. 28, 1994, abandoned.

[51] Int. Cl.$^6$ .................................................. G01R 31/28
[52] U.S. Cl. ............................................. 371/22.1; 364/489
[58] Field of Search ........................... 371/22.1, 22.31, 371/22.34, 22.5, 22.6, 25.1, 27.4, 27.5, 22.35, 27.3, 27.6, 28; 395/183.01, 183.06, 183.13, 183.18, 183.19, 185.01; 364/491, 488, 489, 580; 324/765

[56] References Cited

U.S. PATENT DOCUMENTS

| | | | |
|---|---|---|---|
| 4,613,970 | 9/1986 | Masuda et al. | |
| 4,749,947 | 6/1988 | Gheewala | |
| 4,862,399 | 8/1989 | Freeman | 364/580 |
| 4,910,417 | 3/1990 | El Gamal et al. | 307/465 |
| 5,179,534 | 1/1993 | Pierce et al. | 365/189.01 |
| 5,198,757 | 3/1993 | Azumai | 324/158 R |
| 5,206,862 | 4/1993 | Chandra et al. | 371/27 |
| 5,282,148 | 1/1994 | Poirot et al. | 364/491 |
| 5,331,571 | 7/1994 | Aronoff et al. | |

FOREIGN PATENT DOCUMENTS

| | | |
|---|---|---|
| 174236 | 3/1986 | European Pat. Off. |
| 58-20570 | 11/1983 | Japan |

OTHER PUBLICATIONS

"Multiplexed PMT Application Note" Texas Instructments, (undated 1994).

H. Ando "Testing VLSI with Random Access Scan" (Fujitsu) IEEE CompCo 80 Digest of Papers, Feb. 25–28, 1980.

K. Wagner "Design For Testability In the Amdahl 580" (Amdhal Corporation, Center for Reliable Computing Computer Systems Laboratory, Stanford University.).

Williams et al. Design for Testability—A Survey, *Procedures of the IEEE*, vol. 71, No. 1, pp. 98–112 Jan. 1983.

*Primary Examiner*—Robert W. Beausoliel, Jr.
*Assistant Examiner*—Nadeem Iqbal
*Attorney, Agent, or Firm*—Townsend and Townsend and Crew LLP; Kenneth R. Allen

[57] ABSTRACT

Methods and related structures for both operating and testing an integrated circuit constructed of combinations of customization logic and embedded cells. Functional modes include an operational mode and a test mode with two submodes. Test terminals of embedded cells, as well as test points in customization logic, are both accessed via a multiplexing scheme using test points of x-y (row and column) wiring traces of a grid-based "cross-check" test structure for both logic testing and embedded cell testing. Common conductors or traces can be used to operate the embedded cells and to control the made and test the embedded cells and customization logic. The x and y lines can be operated as signal lines, as probe lines, as sense lines and as control lines, as needed, using multiplexing according to the invention. In addition, the x and y lines can be used, in connection with analog multiplexers and switches, to probe, stimulate and sense embedded analog signal circuits, subsystems and conditions of an embedded cell. In a case where multiple probe lines are active, test points are held in a high impedance state by placing the clock of latches or flip flops at the intersections of the sense lines and the probe lines in a suspended state and applying only half the switching voltage to the line operative as the sense line. Such latches also permit testing in the presence of asynchronous signals.

10 Claims, 5 Drawing Sheets

METHOD FOR DIRECT ACCESS TEST OF EMBEDDED CELLS AND CUSTOMIZATION LOGIC

This is a Continuation of application Ser. No. 08/726,726, filed Oct. 7, 1996 now abandoned, which is a Continuation of application Ser. No. 08/330,888, filed Oct. 28, 1994 now abandoned, the disclosure of which is incorporated by reference.

BACKGROUND OF THE INVENTION

This invention relates to testing of integrated circuits. In particular, this invention relates to testing of embedded structures and customized structures in very large scale integrated circuits (VLSI circuits) which permit direct access testing of subsystems within VLSI circuits.

Eliminating flaws in the design of an integrated circuit before moving into the production phase is a costly and time consuming process. Due to design errors, fabrication errors, timing problems, or incomplete specifications, many ICs fail to fully perform the task for which they are designed when they are initially integrated into a system. One solution has been so-called built-in self testing or embedded testing.

Figure 1:
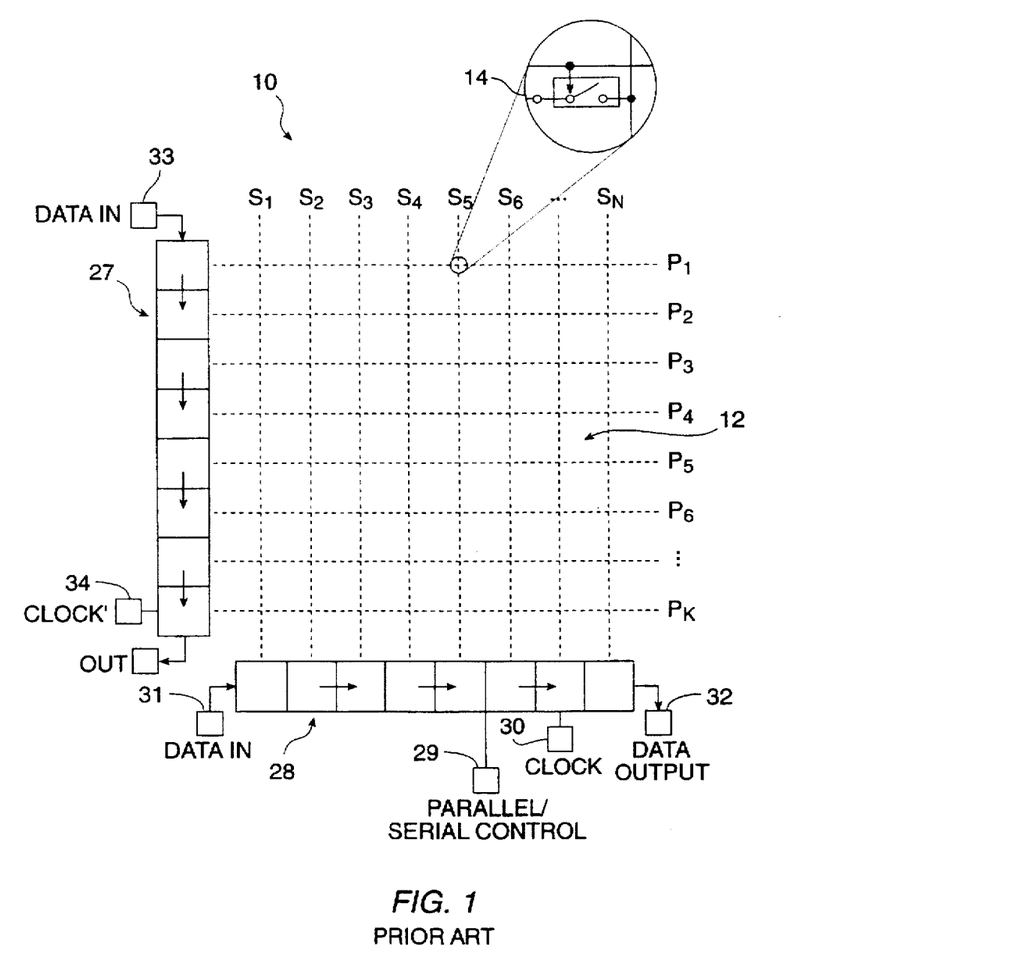
FIG. 1 is a block diagram of a prior art test structure.

One form of embedded testing of VLSI circuitry is based on the use of a grid of test points at the intersections of x and y (row and column) conductive lines overlaying a VLSI "cloud" of circuitry integrated into a chip. Reference is made to U.S. Pat. No. 4,749,947, issued Jun. 7, 1988, entitled GRID-BASED, "CROSS-CHECK" TEST STRUCTURE FOR TESTING INTEGRATED CIRCUITS, inventor Tushar Gheewala for background. Referring to FIG. 1, there is shown a prior art grid-based, "CrossCheck®" test structure 10 used in methods for testing random logic circuits in an integrated circuit, as disclosed in U.S. Pat. No. 4,749,947 owned by the assignee of the present invention. Therein, a grid 12 of test points 14 is accessed by addressable sets of X and Y wiring traces with the Y direction therein for sense lines $S_1 \ldots S_N$ and with the X direction for probe lines $P_1 \ldots P_N$. Traces functioning as probe lines $P_1 \ldots P_N$ select which row (column) of test points 14 is to be accessed, and the sense lines $S_1 \ldots S_N$ read the signal from the selected column (row). In one known embodiment of the prior art, the signals applied through a single input port or pin 31 are applied to the sense lines $S_1 \ldots S_N$ through shift register 28, and data read from the test points 14 by the sense lines $S_1 \ldots S_N$ are fed to a shift register 28 from which the data can be read out through a single input/output (I/O) pin or pad 32, thus minimizing the number of pins which must be dedicated to diagnostics. Because only one port was available to extract data, thus slowing down throughput, one solution suggested has been the use of a linear feedback shift register (LFSR) as a means to compress the data and to generate a signature representation of the data. Because some diagnostically useful information is lost in an LFSR, a need has existed to improve on the prior art techniques.

In other prior art, use has been made of added on-chip test electronics or additional I/Os to access the grid.

One class of circuits which would benefit from in-circuit testing is the embedded cell. An embedded cell is usually a precharacterized and predesigned integrated circuit subsystem designed in many cases with a different design technique and requires a test methodology different from that of the surrounding circuitry. Embedded cells are subsystem designs which are not designed at the outset for testability from the periphery of the integrated circuit (IC) structure. Examples are SRAMs, ROMs, ALUs, microprocessors, and communication interfaces. In the past, additional custom wiring had to be added (or "written" on the IC) to embedded cells to provide access to internal test points from external connections. This wiring was in addition to that required for testing the non-embedded cells, or what is generally referred to as customization logic. This solution caused an undesired increase in area to an integrated circuit.

In the prior art, there have been two classes of test methodologies. One was based on use of a grid pattern. This class is represented by U.S. Pats. 4,747,947 (to CrossCheck Technology) and 4,613,970 (to Hitachi) and by European Patent Publication 174,236 (to Fujitsu). None explain how a grid could be used to test embedded cells. Another class of testing methodology is represented by U.S. Pat. No. 5,331,571 issued Jul. 19, 1994 to NEC Electronics, Inc. of Mountain View, California, and a publication entitled Multiplexed PMT Application Note (undated, copyright 1994) of Texas Instruments. In the last reference, multiplexers are used to connect, in the test mode, embedded cell input/output terminals to IC periphery pads so that tests can be applied to the embedded cells from the pads of the periphery.

However, the prior art does not teach or suggest how to use multiplexing to form a grid of traces for use in operating and testing both embedded cells and customization logic, which is the subject of the present application. Methods and apparatus are needed for testing integrated circuits with embedded cells which minimizes need for additional wiring traces and complexity necessary to access test points within embedded cells.

SUMMARY OF THE INVENTION

According to the invention, methods and related structures for both operating and testing an integrated circuit constructed of combinations of customization logic and embedded cells are disclosed in which three modes of operation are provided. Test terminals of embedded cells, as well as test points in customization logic, are both accessed via a multiplexing scheme using test points of x-y (row and column) wiring traces of a grid-based "cross-check" test structure for both customization logic testing and embedded cell testing. The same traces can be used to carry mode control signals for the multiplexers, probe "select" signals and probe "test" signals for the customization logic as well as the embedded cells, and sense line (test output) signals, as well as the signals which operate and test the embedded cells. The grid-based test structure may be modified at the design and layout stages to allow row and column traces to be rerouted around the locations of embedded cells without disrupting the underlying addressing scheme of a grid based system. In the method, multiplexing of the x and y wiring adjacent the embedded cells allows switching between operational mode and two test modes (employing logic circuit test protocols and embedded cell test protocols), and the sense and probe functions of the x and y wiring can be interchanged. The x and y lines can be used, in connection with analog multiplexers and analog switches, to probe, stimulate and sense embedded analog signal circuits, subsystems and conditions of an embedded cell.

A special input-data-hold latch is preferably disposed at selected test points of the grid and multiplexed between the customized logic test mode and the operational mode to allow for the probing of internal nodes which are held constant during a mode switch operation. Such latches also permit testing in the presence of asynchronous signals.

A further understanding of the nature and advantages of the present invention may be realized by reference to the remaining portions of the specification and the drawings.

DESCRIPTION OF SPECIFIC EMBODIMENTS

Figure 2:
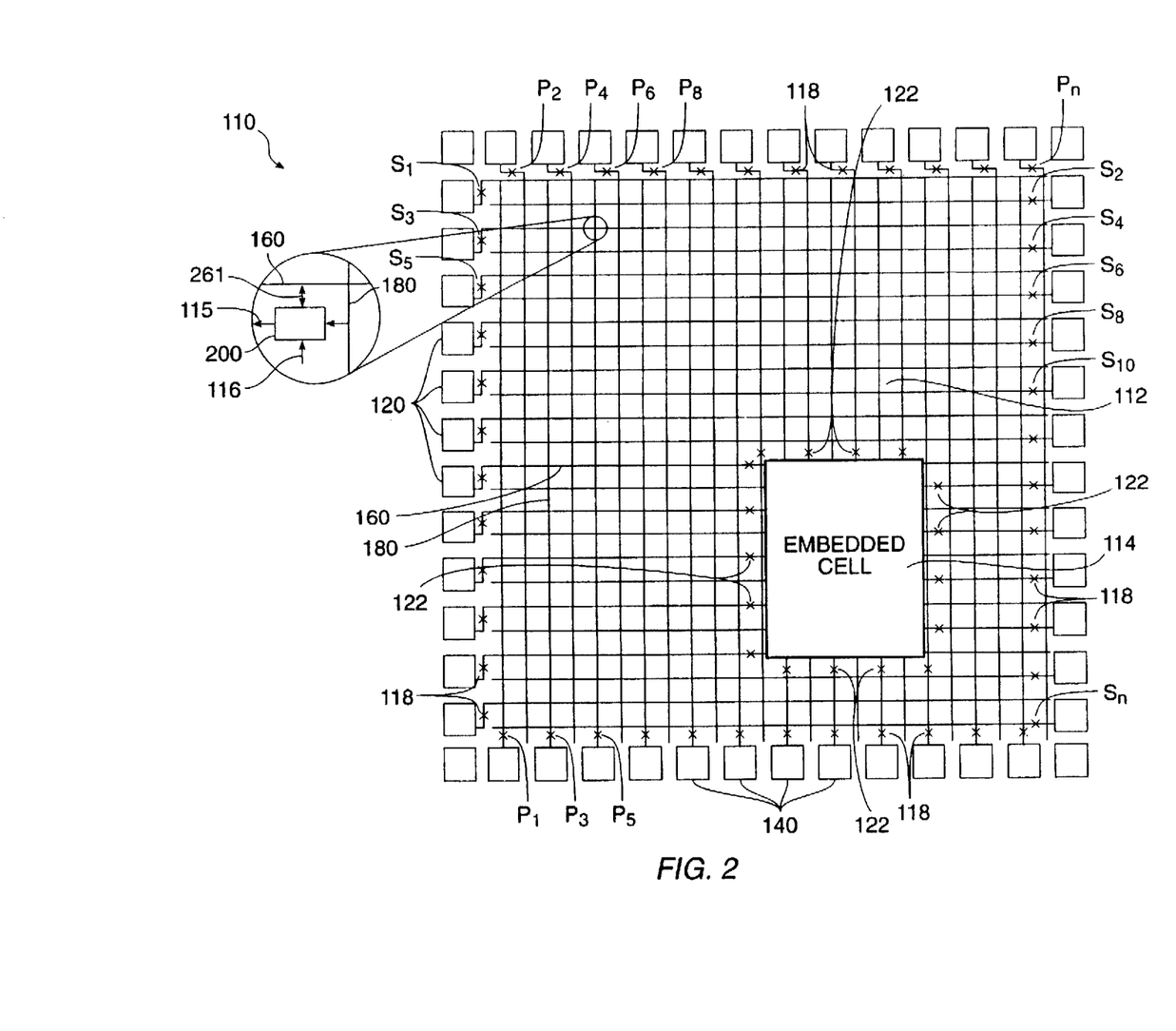
FIG. 2 is a block diagram of a specific embodiment of the present invention showing signal paths for testing.

Referring to FIG. 2, this invention solves problems of the prior art of grid-based testing of an integrated circuit 110 by providing in its design direct access to sense lines $S_1 \ldots S_N$ and probe lines $P_1 \ldots P_N$ for testing both grid-based customization logic 112 and embedded cells 114 by use of first multiplexers (X) 118 at input/output ports or pads 120, 140 of an integrated circuit between the signal lines (not shown) and grid lines 160, 180 serving as the sense lines $S_1 \ldots S_N$ and probe lines $P_1 \ldots P_N$, and also by providing multiplexers 122 adjacent the test terminals of embedded cells 114 in the circuit design also serving as switches between signal lines and the same sense line/probe lines. Two types of circuitry are represented on the integrated circuit 110: customization logic elements 112 and embedded cells 114. Embedded cells 114 are precharacterized circuit designs which generally require a test methodology different from that of the surrounding circuitry. Embedded cells 114 are not designed at the outset for testability from the periphery of the layout area. On the other hand, grid-based testing employs probe lines $P_1 \ldots P_N$ to select elements of customization logic to test, and it also employs sense lines $S_1 \ldots S_N$ to supply excitation signals and/or observe responses to excitation signals. In accordance with a specific aspect of the invention, a latch and preferably a specific type of latch, herein referred to as a suspendable state latch 200, is designed into the customization logic 112 to connect with intersections of grid lines 160 and 180 to access test points 115 in the customization logic. The suspendable state latch 200 is preferably controllable by a clock input 116 (accessed by clock traces--not shown). A more complete description of one embodiment of a suspended state latch in accordance with the invention is found in U.S. patent application Ser. No. 07/929,873 filed Aug. 11, 1992 in the name of Tushar Gheewala entitled METHOD AND APPARATUS FOR TESTING AN INTEGRATED CIRCUIT, the description of which is incorporated herein by reference. These suspended state latches can receive at least two inputs and can provide at least two outputs, one of the ports 261 being bidirectional.

Three distinct operational states of the multiplexers 118 and 122 are recognized: Disable Test State (Operation State), Enable Test State 1 (Customization Logic Test) and Enable Test State 2 (Embedded Cell Test). These states will be apparent from the following description.

Figure 3:
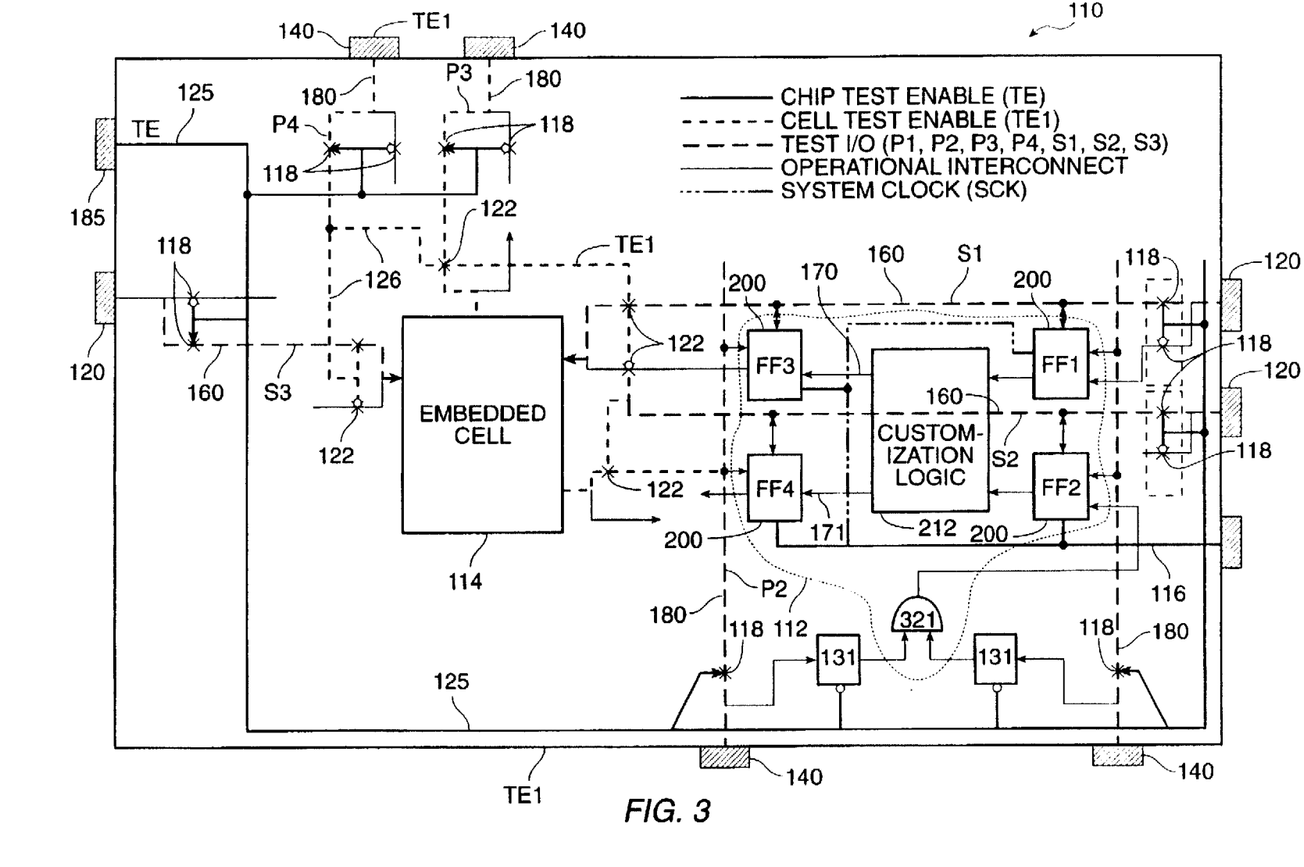
FIG. 3 is a schematic block diagram of a specific embodiment of the present invention showing signal paths for a common test enable signal for both an input and an output from an operational circuit.

FIG. 3 shows the connections of sense lines 160 and probe lines 180 to pads 120 and 140 through multiplexers 118. The multiplexing switches 118 are controlled by a Chip Test Enable signal applied via test pad 185 on line 125. The Chip Test Enable signal also controls an input state retention latch 131, as hereinafter explained.

In the operational mode, Test Enable is held OFF, disconnecting the probe/sense line 160, 180 from pads 120, 140. In this mode, latches 131 are in "transparent" mode, connecting input 140 directly to the operational circuit 321. There is a test mode upon application of the Chip Test Enable signal 125. There are two test submodes, one for testing customization logic and one for testing of embedded cells.

In either test submode, Test Enable (125) is turned ON, the input data on input pads 140 are latched into the state retention latches 131, and typically all test lines 160, 180 are connected through multiplexers 118. Test patterns can now be applied to or observed from sense and probe lines 160, 180 now connected directly to the signal pads 120 and 140 at the edge of the chip 110.

FIG. 3 further illustrates the specific test submodes. To test customization logic in the first test submode, only the chip test enable signal 125 needs to be active. This in turn connects input/output pads 120, 140 to sense lines 160 and probe lines 180 through switches 118. The external inputs to the operational circuit 112 are held by state retention latches 131. To test an internal circuit, for example 212, signals can now be applied to the internal suspendable state latches 200 using probe lines 180 and sense lines 160. Thus in the first test submode, the input/output pads are used to control and observe sense and probe lines, which in turn control internal storage elements to apply test patterns to internal circuits and also to observe the resulting signals to check if the circuit has any defects in it. The internal test points are located at the intersections of the sense and probe lines, where the suspendable state latches are also located. In a compact design, the test points are embedded in the suspendable state latches 200 to be activated selectively to observe output lines 170, 171. (However, the test points need not be located exclusively at the latches. There may be additional test points, such as observation points on the chip. All test points need not be at suspendable state latches. In certain applications, simple multiplexers might be satisfactory sites of test points. Since a chip design is expected to take into account at some level the nature of the test structures, adaptations of a basic test structure design are contemplated.)

The second test submode for testing embedded cells is also shown in FIG. 3. An embedded cell 114 may be operationally connected directly to the customization logic or connected via a suspendable state latch 200 as shown through a mux 122 adjacent the embedded cell 114. A second test enable signal, cell test enable signal TE1 126 is applied, in addition to the chip test enable signal TE 125. TE1 is used to switch the embedded cell explicitly into the second test submode. TE1 also controls multiplexing switches 122. Switches 122 route signals to and from selected external test pads 120 and 140 and disconnect the embedded cell 114 from other internal circuitry, such as the customization logic 112, when TE1 is ON, isolating the embedded cell from operational circuits. Thereupon, the embedded cell 114 can be directly tested by application of test signals at chip pads 120, 140, without interference from the operational circuits connected to it. (The mux mechanisms at the signal pads and near cell test terminals may be latches acting as multiplexers between two test modes.)

To test a RAM 209 representing an embedded cell 114, signals may be applied directly from chip pads 120, 140 to inputs via muxes 122 in a direct access state. It is interesting to note that the probe lines and sense lines may have dual functions and further that the probe lines and sense lines may be physically routed around the embedded cell. In the respective test submodes, the sense lines and probe lines play different roles. In testing of customization logic, the probe lines control which test point is activated, while the sense lines apply test data and observe applied test data. In the embedded cell test submode, the probe lines and the sense lines can be used to both apply and observe test signals. While in FIG. 3, Test Enable 1 (TE1) is shown to be controlled via a signal TE through TE line 125, the signal TE1 could be generated or controlled by any internal or external signal. Similarly, the signal TE could be internally generated.

Specifically, it may be noted that in the first test submode (test of customization logic), sense lines 160 are used both for writing into suspendable state latches 200 and for reading from the suspendable state latches 200 whereas the probe lines 180 are used only to select the suspendable state latches 200 for access through sense lines 160. In contrast during the second test submode (test of embedded cells) sense lines 160 and probe lines 180 may be used for conducting test signals from input/output pads 120, 140 into the cell under test as well as for conducting test responses from the cell to pads 120, 140. In order to be able to access suspendable state latches and embedded cells during test, the sense and probe lines may be physically routed around, over or through the embedded cells 114.

Figure 4:
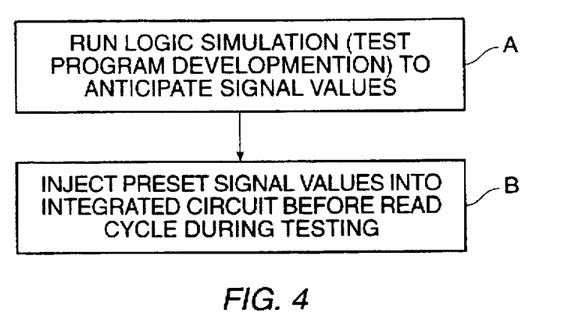
FIG. 4 is flow chart for a test method useful for testing according to one aspect of the invention.

It should be noted that while reading from the input of an asynchronous or level-sensitive latch (as opposed to flipflops) the output of the latch may be driven momentarily to a value different from the one it is supposed to hold. This may occur due to the large capacitance of the sense line being driven at this input as compared to the capacitance offered by the inverter input. Such a momentary change of value is referred to as a "hazard." In the event of such a hazard, other asynchronous or level-sensitive sequential elements in the circuit may change their state to one that is different from the expected state. Due to this reason, a special method is necessary to assure that hazards do not occur while reading from the inputs of level-sensitive or asynchronous latches. Referring to FIG. 4, this method is to anticipate the value of the internal test point by running logic simulation during test program development (Step A). Before reading input values of level-sensitive or asynchronous latches the expected logic values obtained from such simulation, are applied on the sense lines through IO pads (Step B). During the read operation, if the latch input value is the same as expected (indicating no error) then there is no hazard at the latch output. However, if the latch input is in error, having a value opposite to that expected, the sense line is charged to this erroneous value by the input source. This erroneous value is then to be read from the IO pad connected to the sense line.

Figure 5:
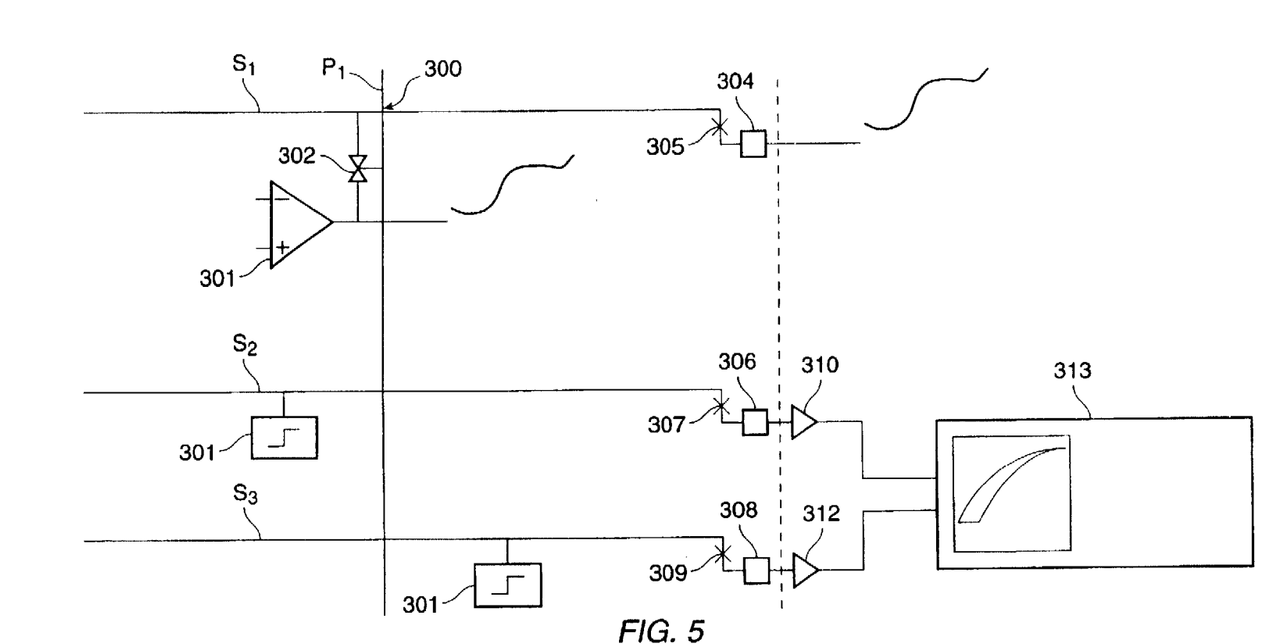
FIG. 5 is a block diagram for illustrating direct observation of internal analog signals according to the present invention.

One of the features of direct access diagnostics is illustrated in FIG. 5, which is a block diagram for illustrating direct observation of internal analog signals according to the invention. Probe line $P_1$ and sense lines $S_1$, $S_2$ $S_3$ have at their intersection 300 a transmission gate switch 302 connecting analog devices 301 to the S test grid wiring traces. Further, the grid is connected to analog test points 304, 306, 308 from which from analog signals can be observed externally with appropriate analog test instruments, such as receivers 310, 312 and analog analyzers 313. The analog test points 304, 306, 308 are accessible through CMOS transmission gates 305, 307, 309 forming analog switches acting as muxes. In addition, other multiplexers (not shown) used to access the sense lines and probe lines need to be able to support analog signals. In this manner, it is possible to directly observe analog signals, relative timing and even power supply noise.

Figure 6:
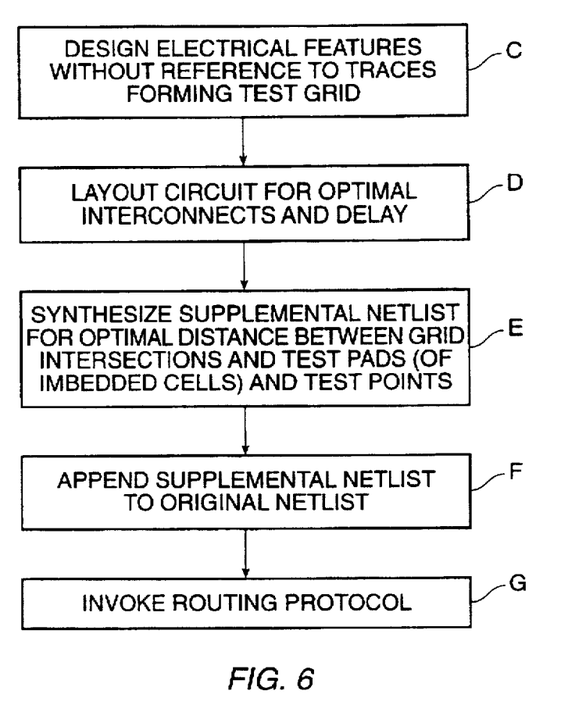
FIG. 6 is a flow chart illustrating the method for constructing an integrated circuit according to the invention.

One of the aspects of the invention is the design protocol for designing an integrated circuit incorporating the features permitting the built in testability. Referring to FIG. 6 a combination of steps which is known in the art is combined in a new method for designing the internally testable integrated circuit containing customization logic elements and embedded cell circuitry. The new method involves the steps of first designing electrical aspects of the basic integrated circuit without reference to signals traces forming a grid overlay to obtain a basic netlist for a basic integrated circuit design (Step C). Then laying out basic integrated circuit design with attention to optimized signal line interconnects and optimized signal delays to obtain a basic circuit layout (Step D). This is a conventionally automated process for which commercial products are available. Thereafter, synthesizing a supplemental netlist of input and output signal trace connections to test points and test pads within the basic circuit layout (Step E). This supplemental netlist is built with attention to optimized distance between selected unique input and output connections and the test points and pads. Then the supplemental netlist is appended to the basic netlist to obtain a composite netlist (Step F), and a routing protocol is run or invoked on the composite netlist to obtain a composite integrated circuit design (Step G). The placement of the functional circuit components and subsystems remains stable, but the new layout may in some cases result in rerouting of wiring traces according to the invention.

While the invention has been particularly shown and described with reference to a specific embodiment thereof, it will be understood by those skilled in the art that the foregoing and other changes in the form and details may be made therein without departing from the spirit or scope of the invention.

What is claimed is:

1. In an integrated circuit having a grid pattern of addressable rows and columns of grid lines and having both customization logic elements and predesigned embedded cells said predesigned embedded cells having test points at least at their inputs and outputs, said test points being specified within a contained cell region and having associated therewith a predesigned cell test protocol differing from a customized test protocol for said customization logic elements, a method for testing the integrated circuit comprising the steps of:

a) applying control signals to deselect an operation mode and to select a test enable mode, wherein, in said test enable mode, first multiplexing means provide connections between selected grid lines in said integrated circuit and signal pads at edges of said integrated circuit and provide connections to selected locations which are adjacent test pads and test points within said integrated circuit;

b1) selecting a first test submode corresponding to said customized test protocol;

b2) providing state suspendable latch means between a selected one of said grid lines and selected ones of said test points;

in said first test submode, c) applying probe signals via first selected grid lines in said integrated circuit, said first selected grid lines being operative as probe lines and coupled through said first multiplexing means to said test points to address at least one of said test points in said customization logic;

d) in accordance with said customized test protocol, selectively applying first excitation signals to said customization logic and detecting output signals from said customization logic elements via second selected grid lines, said second selected grid lines being operative as sense lines; and e) selecting a second test submode corresponding to said predesigned cell test protocol;

in said second test submode, (f) in accordance with said predesigned cell test protocol, selectively applying a test enable signal as a probe signal to activate all test points of input and output terminals of each selected predesigned embedded cell and thereafter applying second excitation signals to test terminals of said predesigned embedded cells via selected ones of said first and second selected grid lines, wherein at least one type of said first and second selected grid lines normally limited to carrying a unidirectional address signal as a probe line in said first test submode is configured for carrying bidirectional data signals as a sense line; and g) receiving output signals from said embedded cells in response to said second excitation signals via said one type of selected ones of said first and second selected grid lines.

2. The method according to claim 1 wherein at least said first selected grid lines and said second selected grid lines are addressable row lines and addressable column lines, and wherein said second test submode selecting step comprises configuring selected second multiplexing means coupled to said external terminals to provide signal paths for said probe lines of said first test submode as bidirectional sense lines of said second test submode to selected test points of said embedded cells.

3. The method according to claim 1 wherein probe signals are protected from causing sense line conflict, further including the steps of:

invoking a suspended state of said latch means to cause said test points and test pads coupled to said selected one of said sense lines to float;

applying a half voltage signal to said selected one of said sense lines;

applying a probe signal via a selected probe line to invoke a response on said selected one of said sense lines; and removing said suspended state to propagate sense line signals through said latch means.

4. The method according to claim 3 wherein analog signal components are rendered testable, further including the steps of:

routing analog signals through said first multiplexing means.

5. An integrated circuit having a grid pattern of addressable rows and columns of grid lines and having both customization logic elements and predesigned embedded cells, said redesigned embedded cells having test points at least at their inputs and outputs, said test points being specified within a contained cell region and having associated therewith a predesigned cell test protocol differing from a customized test protocol for said customization logic elements, said integrated circuit further comprising:

a) a plurality of first multiplexing means adjacent signal pads of said integrated circuit defining switchable connections between selected grid lines in said integrated circuit and signal pads of said integrated circuit and defining switchable connections to selected locations which are test points of said customization logic;

b) a plurality of second multiplexing means at selected locations in said integrated circuit defining connections between selected grid lines and alternately test points of said embedded cells and said test points of said customization logic, a set of said selected grid lines being operable as bidirectional sense lines when said second multiplexing means connect said selected grid lines to said test points of said predesigned embedded cells;

c) probe signal applying means provided via a test enable signal line to said multiplexing means, to enable testing of said predesigned embedded cells; and d) state suspendable latch means between a selected one of said grid lines and selected ones of said test points.

6. The integrated circuit according to claim 5 wherein said signal points providing direct connections to test points and test points for test signals applied external of said integrated circuit.

7. The integrated circuit according to claim 5 wherein at least selected ones of said plurality of first multiplexing means is configured to connect between a single signal pad of an integrated circuit and a plurality of adjacent grid lines.

8. An integrated circuit having a grid pattern of addressable rows and columns of grid lines and having both customization logic elements and predesigned embedded cells, said predesigned embedded cells having test points at least at their inputs and outputs, said test points being specified within a contained cell region and having associated therewith a predesigned cell test protocol differing from a customized test protocol for said customization logic elements, said integrated circuit further comprising:

a) a plurality of first multiplexing means adjacent signal pads of said integrated circuit defining switchable connections between selected grid lines in said integrated circuit and signal pads of said integrated circuit and defining switchable connections to selected locations which are test points of said customization logic;

b) a plurality of second multiplexing means at selected locations in said integrated circuit defining connections between selected grid lines and alternately test points of said embedded cells and said test points of said customization logic, a set of said selected grid lines being operable as bidirectional sense lines when said second multiplexing means connect said selected grid lines to said test points of said predesigned embedded cells; and a plurality of state suspendable latch means between selected sense lines and selected ones of said test points to permit tentative loading of said sense lines during a test protocol.

9. An integrated circuit having a grid pattern of addressable rows and columns of grid lines and having both customization logic elements and predesigned embedded cells, said predesigned embedded cells having test points at least at their inputs and outputs, said test points being specified within a contained cell region and having associated therewith a predesigned cell test protocol differing from a customized test protocol for said customization logic elements, said integrated circuit further comprising:

a) a plurality of first multiplexing means adjacent signal pads of said integrated circuit defining switchable connections between selected grid lines in said integrated circuit and signal pads of said integrated circuit and defining switchable connections to selected locations which are test points of said customization logic; and b) a plurality of second multiplexing means at selected locations in said integrated circuit defining connections between selected grid lines and alternately test points of said embedded cells and said test points of said customization logic, a set of said selected grid lines being operable as bidirectional sense lines when said second multiplexing means connect said selected grid lines to said test points of said predesigned embedded cells;

wherein said first multiplexer means permit propagation of signals of analog signal levels and further including analog storage means on said sense lines and to permit temporary storage of analog signal values during a test protocol.

10. In an integrated circuit having a grid pattern of addressable rows and columns of grid lines and having both customization logic elements and predesigned embedded cells, said predesigned embedded cells having test points at least at their inputs and outputs, said test points being specified within a contained cell region and having associated therewith a predesigned cell test protocol differing from a customized test protocol for said customization logic elements, a method for testing the integrated circuit comprising the steps of:

a) applying control signals to deselect an operation mode and to select a test enable mode, wherein, in said test enable mode, first multiplexing means provide connections between selected grid lines in said integrated circuit and signal pads at edges of said integrated circuit and provide connections to selected locations which are adjacent test pads and test points within said integrated circuit;

b) selecting a first test submode corresponding to said customized test protocol;

in said first test submode, c) applying probe signals via first selected grid lines in said integrated circuit, said first selected grid lines being operative as probe lines and coupled through said first multiplexing means to said test points to address at least one of said test points in said customization logic;

d) in accordance with said customized test protocol, selectively applying first excitation signals to said customization logic and detecting output signals from said customization logic elements via second selected grid lines, said second selected grid lines being operative as sense lines; and e) selecting a second test submode corresponding to said predesigned cell test protocol;

in said second test submode, (f) in accordance with said predesigned cell test protocol, selectively applying second excitation signals to test terminals of said predesigned embedded cells via selected ones of said first and second selected grid lines; and g) receiving output signals from said embedded cells in response to said second excitation signals via selected ones of said first and second selected grid lines;

wherein probe signals are protected from causing sense line conflict, further including the steps of:

providing state suspendable latch means between a selected one of said sense lines and selected ones of said test points and test pads;

invoking a suspended state of said latch means to cause said test points and test pads coupled to said selected one of said sense lines to float;

applying a half voltage signal to said selected one of said sense lines;

applying a probe signal via a selected probe line to invoke a response on said selected one of said sense lines; and removing said suspended state to propagate sense line signals through said latch means.

* * * * *